(12) United States Patent
Lai et al.

(10) Patent No.: US 11,656,713 B2
(45) Date of Patent: May 23, 2023

(54) TOUCH INDICATING COVER AND ELECTRONIC DEVICE USING THE SAME

(71) Applicant: Darwin Precisions Corporation, Hsinchu County (TW)

(72) Inventors: Yu-Jen Lai, Hsinchu County (TW); Yi-Feng Chen, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 17/534,471

(22) Filed: Nov. 24, 2021

(65) Prior Publication Data

US 2022/0317799 A1 Oct. 6, 2022

(30) Foreign Application Priority Data

Mar. 30, 2021 (TW) .................................. 110111677

(51) Int. Cl.
*G06F 3/041* (2006.01)
*G06F 1/16* (2006.01)
*H03K 17/96* (2006.01)

(52) U.S. Cl.
CPC .......... *G06F 3/0416* (2013.01); *G06F 1/1643* (2013.01)

(58) Field of Classification Search
USPC ........................................................ 345/173
See application file for complete search history.

(56) References Cited

U.S. PATENT DOCUMENTS

| 2004/0203486 | A1* | 10/2004 | Shepherd | H04B 1/3888 455/575.1 |
| 2010/0296025 | A1* | 11/2010 | Gourlay | G02B 6/0065 362/627 |
| 2012/0052929 | A1* | 3/2012 | Thammasouk | H04M 1/0283 455/575.1 |
| 2012/0068962 | A1* | 3/2012 | Yamamoto | G06F 1/1692 345/174 |
| 2013/0076542 | A1* | 3/2013 | Tanaka | G10H 1/0558 200/5 A |
| 2014/0218632 | A1* | 8/2014 | Pyoun | G06F 3/0445 349/12 |

(Continued)

FOREIGN PATENT DOCUMENTS

CN 102185605 A 9/2011
TW 201410435 A 3/2014

*Primary Examiner* — Chineyere D Wills-Burns
(74) *Attorney, Agent, or Firm* — WPAT, P.C

(57) ABSTRACT

A touch indicating cover includes a light-guide plastic piece, a printed circuit layer, an ink layer, a passivation layer, and a light-emitting component. The light-guide plastic piece has a first surface and a second surface opposite to each other, wherein the second surface of the light-guide plastic piece comprises a plurality of microstructures. The printed circuit layer is disposed on the first surface of the light-guide plastic piece. The ink layer is disposed on the printed circuit layer and the first surface of the light-guide plastic piece, wherein the ink layer comprises a light-emitting pattern region corresponding to the microstructures. The passivation film is disposed on the ink layer. The light-emitting component is embedded in the first surface of the light-guide plastic piece and connected to the printed circuit layer, wherein the light-emitting component is disposed adjacent the light-emitting pattern region.

19 Claims, 10 Drawing Sheets

(56) References Cited

U.S. PATENT DOCUMENTS

| | | | | |
|---|---|---|---|---|
| 2014/0340353 A1* | 11/2014 | Chen | ............... | H03K 17/962 |
| | | | | 345/174 |
| 2015/0103018 A1* | 4/2015 | Kamin-Lyndgaard | ............ | |
| | | | | G06F 3/0443 |
| | | | | 345/173 |
| 2017/0139442 A1* | 5/2017 | Yoshizumi | ............ | G06F 1/1681 |
| 2017/0146890 A1* | 5/2017 | Shoemake | ............ | G06F 1/1632 |
| 2018/0224966 A1* | 8/2018 | Church | ............ | G06F 3/0446 |
| 2018/0286926 A1* | 10/2018 | Kim | ............ | H10K 50/858 |
| 2019/0294846 A1* | 9/2019 | Li | ............ | G06F 3/0412 |
| 2019/0341957 A1* | 11/2019 | Coverstone | ......... | H04M 1/0249 |
| 2021/0294475 A1* | 9/2021 | Lee | ............ | G06F 1/1626 |
| 2021/0399183 A1* | 12/2021 | Hussell | ............ | H01L 33/62 |

* cited by examiner

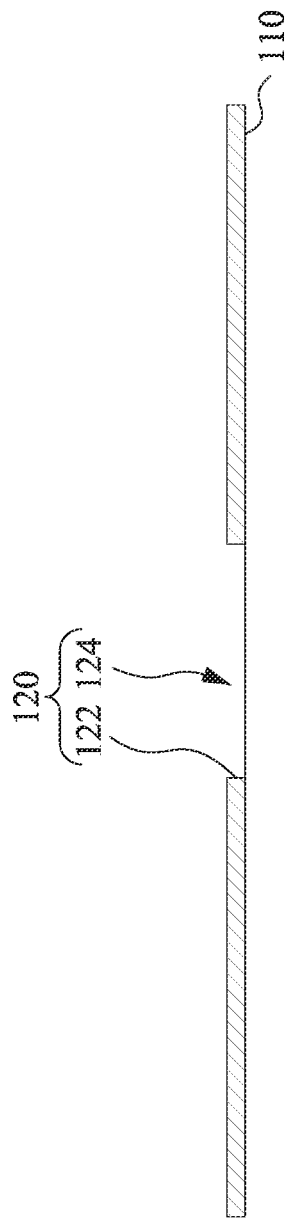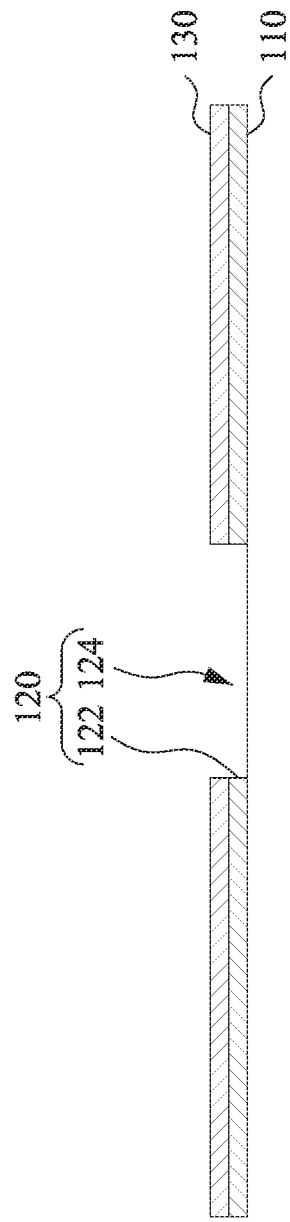

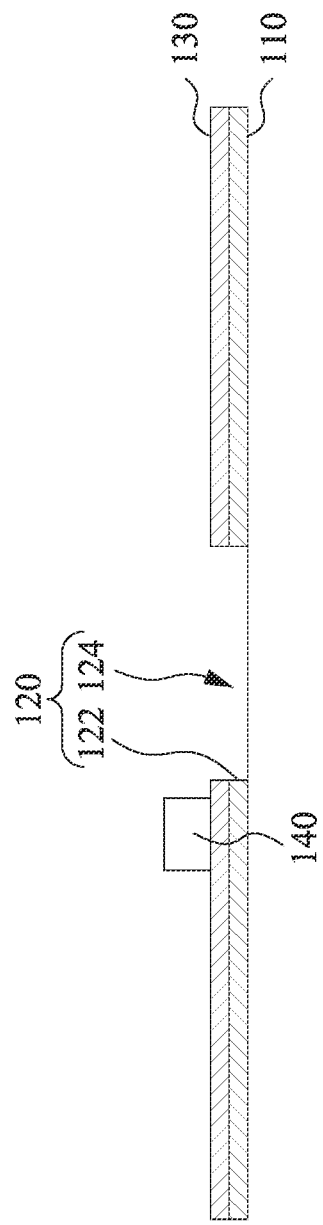
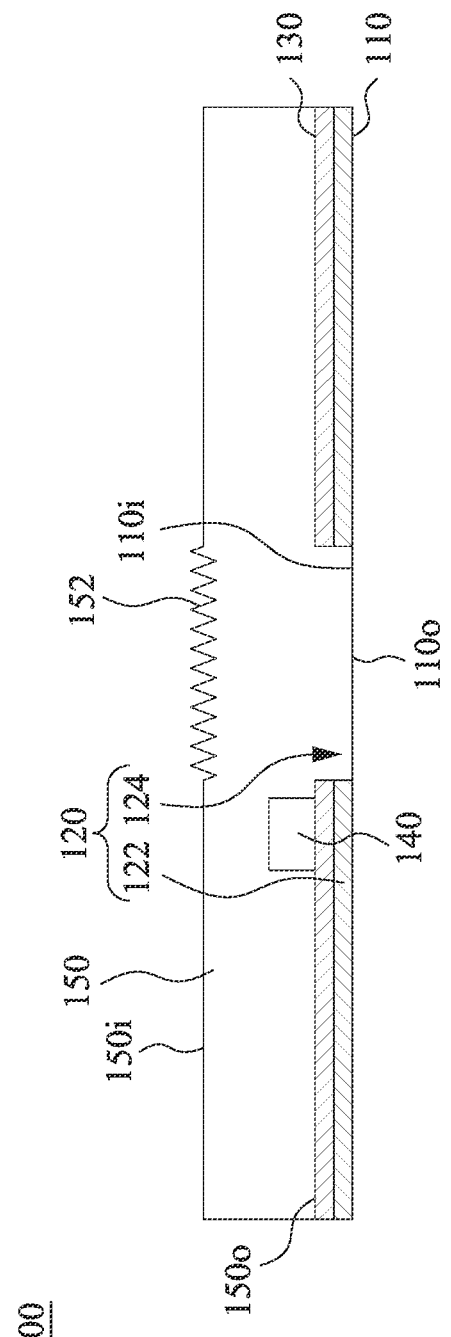

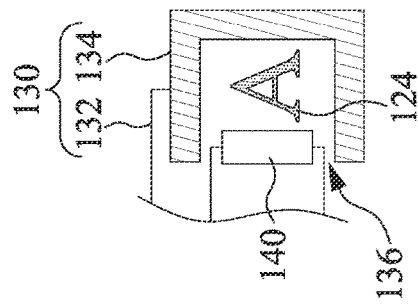
Fig. 4C
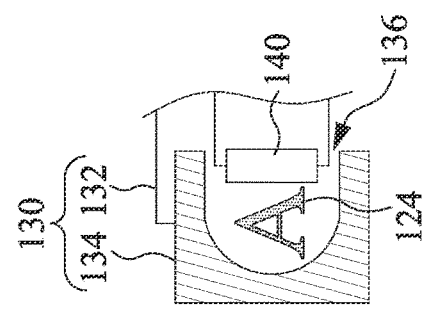
Fig. 4F
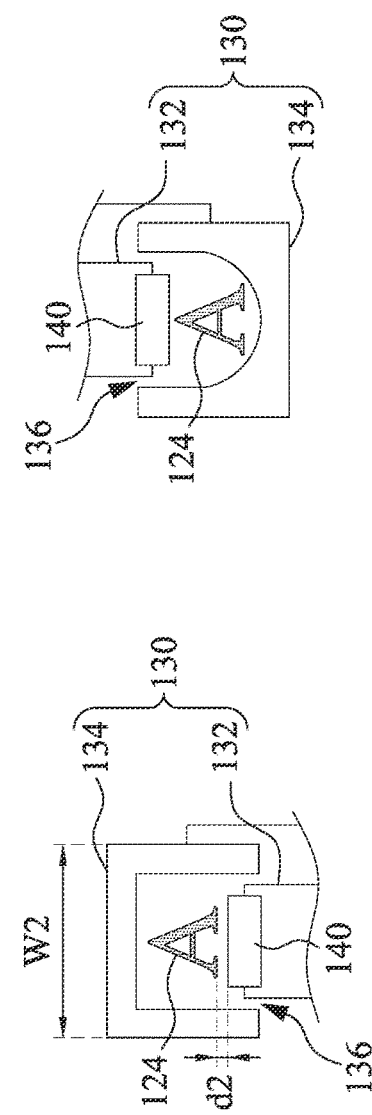
Fig. 4B
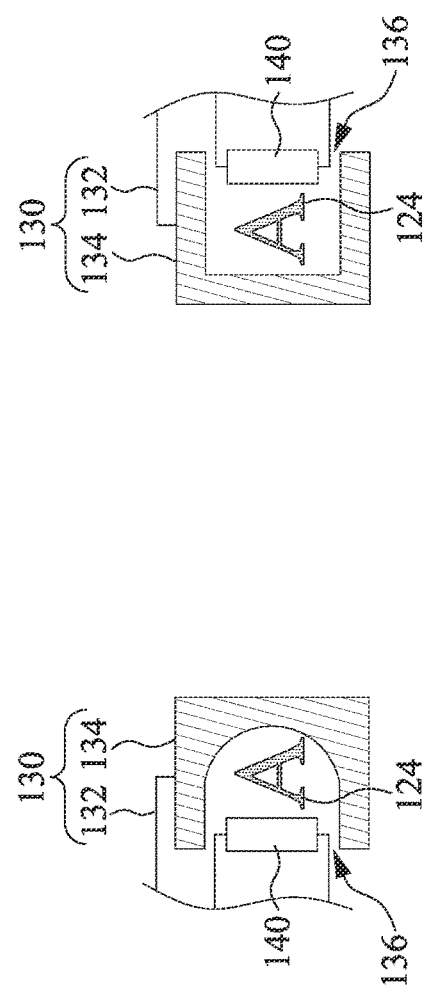
Fig. 4E
Fig. 4A
Fig. 4D

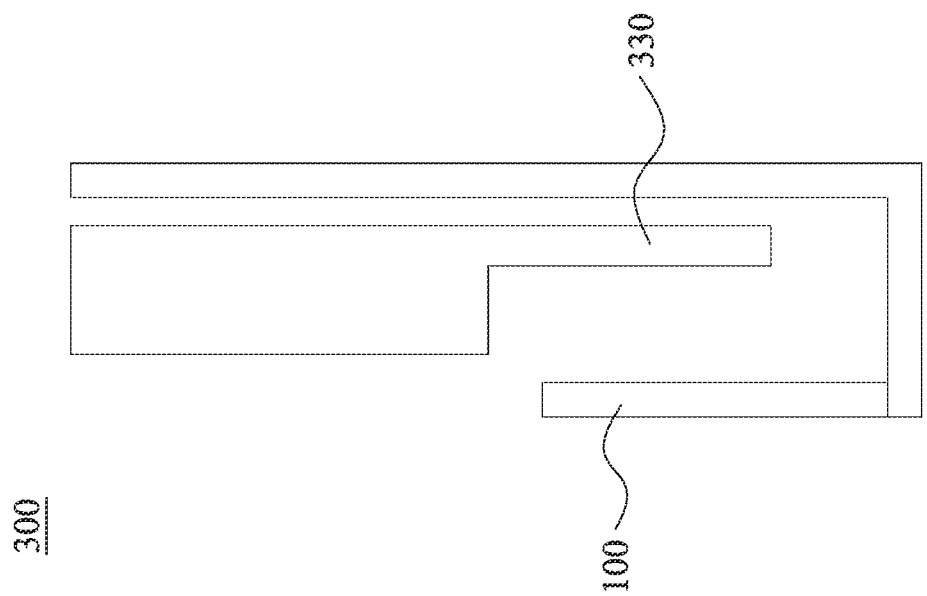

TOUCH INDICATING COVER AND ELECTRONIC DEVICE USING THE SAME

RELATED APPLICATIONS

This application claims priority to Taiwanese Application Serial Number 110111677, filed Mar. 30, 2021, which is herein incorporated by reference.

BACKGROUND

Field of Invention

The present invention relates to a touch indicating cover and an electronic device using the same.

Description of Related Art

Touch technique combines the display and the input module of the electronic device, users may move fingers on the display to finish the corresponding operation. Generally, a side frame is required in the touch device to hide the peripheral wirings of the touch device. However, with the rapid development of the mobile phones, pads, and other electronic device having touch function, the requirements of the appearance and the touch area of the electronic device are increased. Therefore, many electronic devices need narrow frame and thinning design.

SUMMARY

According to an aspect of the disclosure, a touch indicating cover includes a light-guide plastic piece, a printed circuit layer, an ink layer, a passivation layer, and a light-emitting component. The light-guide plastic piece has a first surface and a second surface opposite to each other, wherein the second surface of the light-guide plastic piece comprises a plurality of microstructures. The printed circuit layer is disposed on the first surface of the light-guide plastic piece. The ink layer is disposed on the printed circuit layer and the first surface of the light-guide plastic piece, wherein the ink layer comprises a light-emitting pattern region corresponding to the microstructures. The passivation film is disposed on the ink layer. The light-emitting component is embedded in the first surface of the light-guide plastic piece and connected to the printed circuit layer, wherein the light-emitting component is disposed adjacent the light-emitting pattern region.

According to some embodiments of the disclosure, the printed circuit layer includes a conductive paste or a conductive ink.

According to some embodiments of the disclosure, the printed circuit layer includes a touch sensing pattern surrounding the light-emitting pattern region, and the light-emitting component is disposed at a side of the touch sensing pattern.

According to some embodiments of the disclosure, a minimum distance between the touch sensing pattern and the light-emitting component ranges from 1.5 mm to 10 mm.

According to some embodiments of the disclosure, the printed circuit layer includes a touch sensing pattern partially surrounding the light-emitting pattern region, and the light-emitting component is disposed at an opening of the touch sensing pattern.

According to some embodiments of the disclosure, a minimum distance between the touch sensing pattern and the light-emitting component ranges from 0.5 mm to 6 mm.

According to some embodiments of the disclosure, the printed circuit layer includes a touch sensing pattern, and the touch sensing pattern is a frame pattern.

According to some embodiments of the disclosure, the printed circuit layer includes a touch sensing pattern, and the touch sensing pattern is a hollow pattern having a plurality of lines.

According to some embodiments of the disclosure, the touch sensing pattern is a grid pattern.

According to some embodiments of the disclosure, the touch sensing pattern is a net pattern.

According to some embodiments of the disclosure, the printed circuit layer includes a touch sensing pattern, and the touch sensing pattern is a solid pattern.

According to some embodiments of the disclosure, the printed circuit layer includes a touch sensing pattern, and a width of the touch sensing pattern ranges from 5 mm to 25 mm.

According to some embodiments of the disclosure, an electronic device includes a display panel and the touch indicating cover. The touch indicating cover partially overlaps the display panel in a width direction of the electronic device, and the touch indicating cover is a frame of the electronic device.

According to some embodiments of the disclosure, an electronic device includes a circuit board and the touch indicating cover, wherein the touch indicating cover partially overlaps the circuit board in a width direction of the electronic device.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings, FIG. 1A to FIG. 1E are cross-sectional views of different stages of a flow of a method of fabricating a touch indicating cover, according to some embodiments of the disclosure;

FIG. 4A to FIG. 4F are top views of the touch indicating cover, according to different embodiments of the disclosure;

FIG. 6B is a cross-sectional view of the electronic device of FIG. 6A according to some embodiments of the disclosure.

DESCRIPTION OF THE EMBODIMENTS

Figure 2:
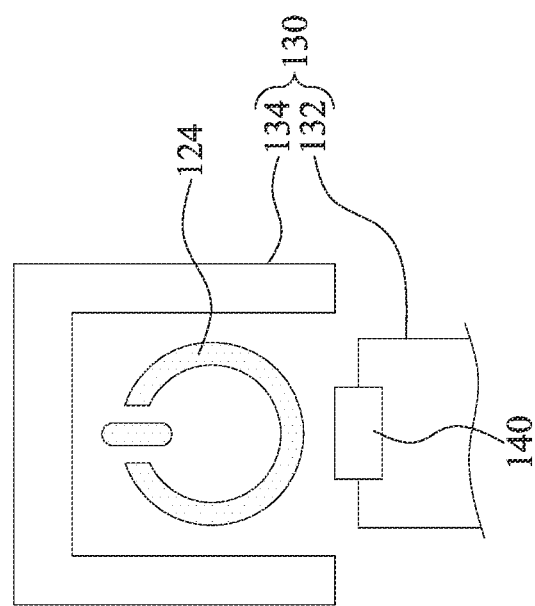
FIG. 2 is a top view of the touch indicating cover, according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

According to some embodiments of the disclosure, a touch indicating cover fabricated by an injection molding technique, such that a thickness and a space of the touch indicating cover are reduced and are benefit to purposes of thinning design and narrow frame.

Reference is made to FIG. 1A to FIG. 1E, which are cross-sectional views of different stages of a flow of a method of fabricating a touch indicating cover, according to some embodiments of the disclosure. As shown in FIG. 1A, a film 110 is provided. The material of the film 110 can be a flexible material, such as polyimide (PI), polyethylene terephthalate (PET), polyethylene naphthalate (PEN), acrylonitrile butadiene styrene (ABS), polycarbonate (PC), or the combinations thereof.

Then, as shown in FIG. 1B, an ink layer 120 is formed on the film 110. The ink layer 120 can be directly formed on a surface of the film 110 by an inkjet printing process or a screen printing process. An ink 122 of the ink layer 120 may have a high light-shielding property. In some embodiments, the ink 122 can be a flat ink or a varnish ink, the ink 122 can be a single-color ink or a combination of multi-color inks, based on the design requirements.

In some embodiments, the ink layer 120 has at least one light-emitting pattern region 124. The light-emitting pattern region 124 is the portion of the ink layer 120 that is free of the ink 122. Namely, the surface of the film 110 is disposed with the patterned ink layer 120, and the region of the surface of the film 110 that is free of being disposed with the ink 122 is defined as the light-emitting pattern region 124. The pattern of the light-emitting pattern region 124 can be a functional pattern or a decoration pattern. For example, the pattern of the light-emitting pattern region 124 can be a power symbol, a volume symbol, an arrow symbol, or an alphabetic symbol, but the disclosure is not limited to.

Then, as shown in FIG. 1C, a printed circuit layer 130 is printed on the ink layer 120. The printed circuit layer 130 can be formed by an inkjet printing process or a screen printing process, such that a circuit pattern is directly formed on the ink layer 120. The circuit pattern is cured at a low temperature, and the printed circuit layer 130 having the circuit is directly formed on the surface of the ink layer 120. That is, the printed circuit layer 130 is directly formed on the surface of the ink layer 120 without using any adhesive or the process such as film to film bonding, therefore the thickness of the product can be efficiently reduced accordingly.

In some embodiments, the printed circuit layer 130 is disposed only on the ink 122 of the ink layer 120, such that the printed circuit layer 130 is hidden by the ink 122 to maintain the appearance beauty. In some embodiments, the printed circuit layer 130 can include touch sensing patterns and/or control circuits. In some embodiments, the material of the printed circuit layer 130 can be conductive paste having conductive particles or conductive nanowires, such as a silver paste. In some embodiments, the material of the printed circuit layer 130 can be conductive ink such as ink having graphite powder. In some embodiments, the material of the printed circuit layer 130 can be transparent conductive material such as PEDOT:PSS or carbon nano tubes (CNT), in which the sensing patterns of the printed circuit layer 130 may overlap the light-emitting pattern region 124 to increase the sensing area.

Then, as shown in FIG. 1D, at least one of light-emitting component 140 is disposed on the printed circuit layer 130, and the light-emitting component 140 is disposed adjacent the light-emitting pattern region 124 of the ink layer 120. More particularly, the light-emitting component 140 is connected to the control circuit of the printed circuit layer 130, and the control circuit provides voltage to the light-emitting component 140, to control whether the light-emitting component 140 emit or not. Because the light-emitting component 140 is also shielded by the ink 122 of the ink layer 120, the light-emitting component 140 can be hidden as well, to maintain the appearance beauty.

Finally, as shown in FIG. 1E, an injection molding process is performed to form a light-guide plastic piece 150 on the structure 10 as shown in FIG. 1D. For example, the structure 10 of FIG. 1D is placed in a mold cavity of a mold, and a melted thermoplastic material is injected into the mold by the injection molding process. The melted thermoplastic material fills the mold cavity and combines with the structure 10. After the thermoplastic material is cooled, the light-guide plastic piece 150 is formed and is seamlessly combined with the structure 10, thereby forming a touch indicating cover 100.

The light-guide plastic piece 150 is combined with the structure 10 by using the injection molding process. More particularly, the light-guide plastic piece 150 is combined with the side of the film 110 having the light-emitting component 140 thereon. Thus the film 110 and the ink layer 120 and the printed circuit layer 130 thereon are in contact with and fit the surface of the light-guide plastic piece 150, and the light-emitting component 140 is embedded in the light-guide plastic piece 150.

In some embodiments, the material of the light-guide plastic piece 150 can be polymethyl methacrylate (PMMA) or Polycarbonate (PC). A plurality of microstructures 152 are formed protruding from the surface of the light-guide plastic piece 150 by the design of the mold cavity. The profile of the microstructures 152 can be a pyramid, a cone, a prism, or any other possible shape having light-guiding or light-emitting function. The position of the microstructures 152 is arranged corresponding to the position of the light-emitting pattern region 124, in which a projection of the microstructures 152 on the film 110 at least partially overlaps a projection of the light-emitting pattern region 124 on the film 110.

Here, the touch indicating cover 100 including the film 110, the ink layer 120, the printed circuit layer 130, the light-emitting component 140, and the light-guide plastic piece 150 is provided. The light-guide plastic piece 150 has a first surface 150o and a second surface 150i opposite to each other, in which the first surface 150o of the light-guide plastic piece 150 is the surface that faces an appearance side of the touch indicating cover 100, and the second surface 150i of the light-guide plastic piece 150 has the microstructures 152.

The printed circuit layer 130 is disposed on the first surface 150o of the light-guide plastic piece 150. The light-emitting component 140 is embedded in the first surface 150o of the light-guide plastic piece 150 and is connected to the printed circuit layer 130. The light-guide plastic piece 150 is formed by the injection molding process, therefore the light-emitting component 140 and the light-guide plastic piece 150 are seamlessly combined. The light emitted from the light-emitting component 140 directly enters the light-guide plastic piece 150 without passing through additional interface such as an air. The printed circuit layer 130 further includes a touch sending pattern, which is integrately formed with the control circuit of controlling the light-emitting component 140.

The ink layer 120 is disposed on the printed circuit layer 130 and on the first surface 150o of the light-guide plastic piece 150, in which the ink layer 120 has the light-emitting pattern region 124 corresponding to the microstructures 152 of the light-guide plastic piece 150. The light emitted from the light-emitting component 140 is diffused by the light-guide plastic piece 150, and the light leaves the touch indicating cover 100 through the light-emitting pattern region 124 by the design of the microstructures 152, thereby providing an indication function.

The film 110 is disposed on the ink layer 120, and the film 110 is directly in contact with the light-guide plastic piece 150 at the light-emitting pattern region 124. The film 110 is arranged at the outmost layer of the touch indicating cover 100, thus the film 110 can be referred as a passivation layer.

More particularly, the film 110 has a first surface 110o and a second surface 110i opposite to each other. The ink layer 120, the printed circuit layer 130, the light-emitting component 140, and the light-guide plastic piece 150 are disposed on the second surface 110i of the film 110. The first surface 110o is the appearance surface of the touch indicating cover 100 and also serves as the operation surface of the touch indicating cover 100. Users may touch the first surface 110o of the touch indicating cover 100 to operate the corresponding function according to the instruction provided by the light-emitting pattern region 124.

The touch indicating cover 100 fabricated by above method is formed without using an adhesive or a film-to-film bonding process. The elements of the touch indicating cover 100 are seamlessly combined with each other. Therefore, the thickness of the touch indicating cover 100 can be efficiently reduced to meet the trend of thin products.

Reference is now made to FIG. 2, which is a top view of the touch indicating cover, according to some embodiments of the disclosure. For the purpose of drawing clarity, only the light-emitting pattern region 124, the printed circuit layer 130, and the light-emitting component 140 are illustrated in the drawings, in which the light-emitting pattern region 124 is an empty region defined by the ink. It is noted that the light-emitting pattern region 124 is marked with screen dots for better recognizing.

The printed circuit layer 130 includes the control circuit 132 and the touch sensing pattern 134. The control circuit 132 is connected to the light-emitting component 140, such as to a cathode and an anode of a light-emitting diode, to provide voltage to the light-emitting component 140. The light-emitting component 140 is disposed adjacent the light-emitting pattern region 124. The touch sensing pattern 134 is disposed at least partially surrounding the light-emitting pattern region 124, to detect whether there is a conductive object, such as a finger, nearby or touching, and to transmit the corresponding signals to a processor.

Reference is now made to FIG. 3A to FIG. 3G and FIG. 4A to FIG. 4F, which are top views of the touch indicating cover, according to different embodiments of the disclosure. For the purpose of drawing clarity, only the light-emitting pattern region 124, the printed circuit layer 130, and the light-emitting component 140 are illustrated in the drawings, in which the light-emitting pattern region 124 is an empty region defined by the ink. It is noted that the light-emitting pattern region 124 is marked with screen dots for better recognizing.

Figure 3A:
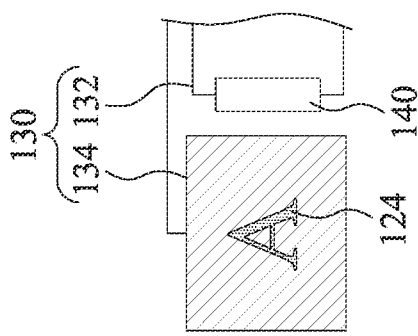
FIG. 3A to FIG. 3G are top views of the touch indicating cover, according to different embodiments of the disclosure.

As shown in FIG. 3A, the touch sensing pattern 134 of the printed circuit layer 130 is a frame formed by a line, and the light-emitting pattern region 124 is within the touch sensing pattern 134. The light-emitting component 140 is disposed outside of the touch sensing pattern 134 and is located at a side of the touch sensing pattern 134.

Figure 3B:
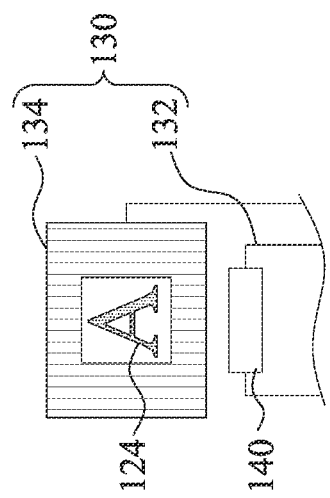
Figure 3C:
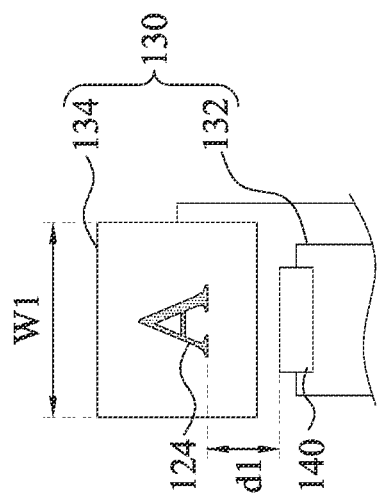
Figure 3D:
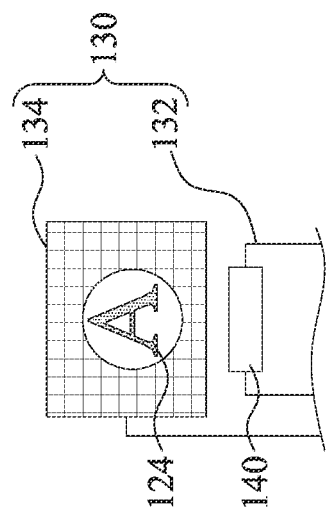

Alternatively, as shown in FIG. 3B to FIG. 3D, the touch sensing pattern 134 is a hollow pattern formed by a plurality of lines, and the touch sensing pattern 134 surrounds or overlaps the light-emitting pattern region 124. The light-emitting component 140 is disposed outside of the touch sensing pattern 134. The light-emitting component 140 is disposed at a side of the touch sensing pattern 134. The pattern of the touch sensing pattern 134 can be a grid having inclined strips as shown in FIG. 3B, net shape as shown in FIG. 3C, or bar shape as shown in FIG. 3D. The touch sensing pattern 134 may overlap the light-emitting pattern region 124, as shown in FIG. 3B. The touch sensing pattern 134 may be spaced from the light-emitting pattern region 124 and leave a circle transparent space, as shown in FIG. 3C, or leave a rectangle transparent space, as shown in FIG. 3D.

Figure 3F:
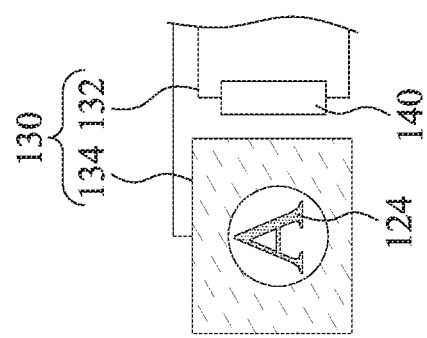
Figure 3E:
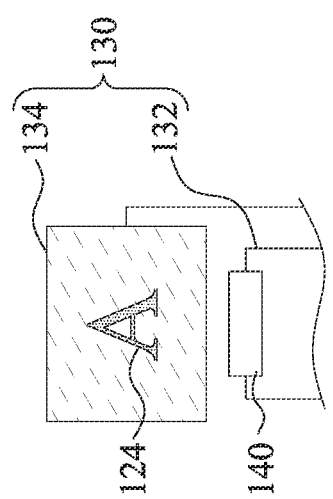
Figure 3G:
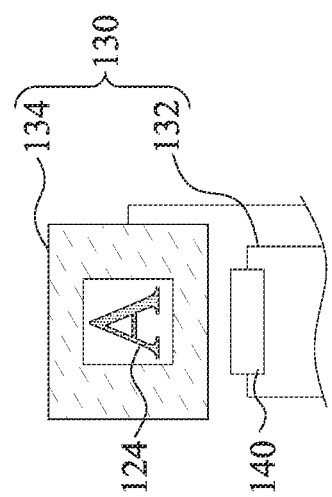

In some other embodiments, as shown in FIG. 3E to FIG. 3G, the pattern of the touch sensing pattern 134 of the printed circuit layer 130 can be a solid pattern, and the touch sensing pattern 134 is configured surrounding the light-emitting pattern region 124. The solid touch sensing pattern 134 fits the profile of the light-emitting pattern region 124, as shown in FIG. 3E. Alternatively, the solid touch sensing pattern 134 is spaced from the light-emitting pattern region 124 and leaves a circle transparent region therebetween (as shown in FIG. 3F) or leaves a rectangle transparent region therebetween (as shown in FIG. 3G).

In some embodiments, as shown in FIG. 3A for example, the width w1 of the touch sensing pattern 134 ranges from 5 mm to 25 mm, and the minimum distance d1 from the light-emitting component 140 to the light-emitting pattern region 124 ranges from 1.5 mm to 10 mm. Above parameter limitations can satisfy both space utilization and light property requirements and are benefit to further reduce the space of arranging the touch indicating cover 100.

In FIG. 3A to FIG. 3G, the touch sensing pattern 134 of the printed circuit layer 130 is configured surrounding the light-emitting pattern region 124. However, in some other embodiments, the touch sensing pattern 134 of the printed circuit layer 130 is arranged partially surrounding the light-emitting pattern region 124, as shown in FIG. 4A to FIG. 4F.

In some embodiments, the touch sensing pattern 134 of the printed circuit layer 130 is a frame pattern that disposed around the light-emitting pattern region 124, as shown in FIG. 4A and FIG. 4B. The touch sensing pattern 134 has an opening 136, and the light-emitting component 140 is disposed at the opening 136 of the touch sensing pattern 134.

In some embodiments, the touch sensing pattern 134 of the printed circuit layer 130 is a hollow pattern including a plurality of lines and is disposed around the light-emitting pattern region 124, as shown in FIG. 4C. Alternatively, the touch sensing pattern 134 of the printed circuit layer 130 is a net pattern that disposed around the light-emitting pattern region 124, as shown in FIG. 4D. In some other embodiments, the touch sensing pattern 134 of the printed circuit layer 130 can be a solid pattern that disposed around the light-emitting pattern region 124, as shown in FIG. 4E and FIG. 4F.

The direction of the opening 136 of the touch sensing pattern 134 of the printed circuit layer 130 can be chosen according to the arrangement of the light-emitting component 140. As shown in FIG. 4A to FIG. 4F, the direction of the opening 136 can face upside, downside, left side, or right side. The surface of the touch sensing pattern 134 of the printed circuit layer 130 facing the opening 136 can be a plane surface, as shown in FIGS. 4A, 4C, and 4E. Alternatively, the touch sensing pattern 134 of the printed circuit layer 130 facing the opening 136 can be a curved surface, as shown in FIGS. 4B, 4D, and 4F.

In some embodiments, as shown in FIG. 4A for example, the width w2 of the touch sensing pattern 134 ranges from 5 mm to 25 mm, and the minimum distance d2 from the light-emitting component 140 to the light-emitting pattern region 124 ranges from 0.5 mm to 6 mm. There is no touch sensing pattern 134 present between the light-emitting component 140 and the light-emitting pattern region 124, thus the light would not be absorbed by the touch sensing pattern 134, and the distance between the light-emitting component 140 and the light-emitting pattern region 124 can be further reduced, which is benefit to space utilization and light property requirements and further reduces the space of arranging the touch indicating cover 100.

Figure 5B:
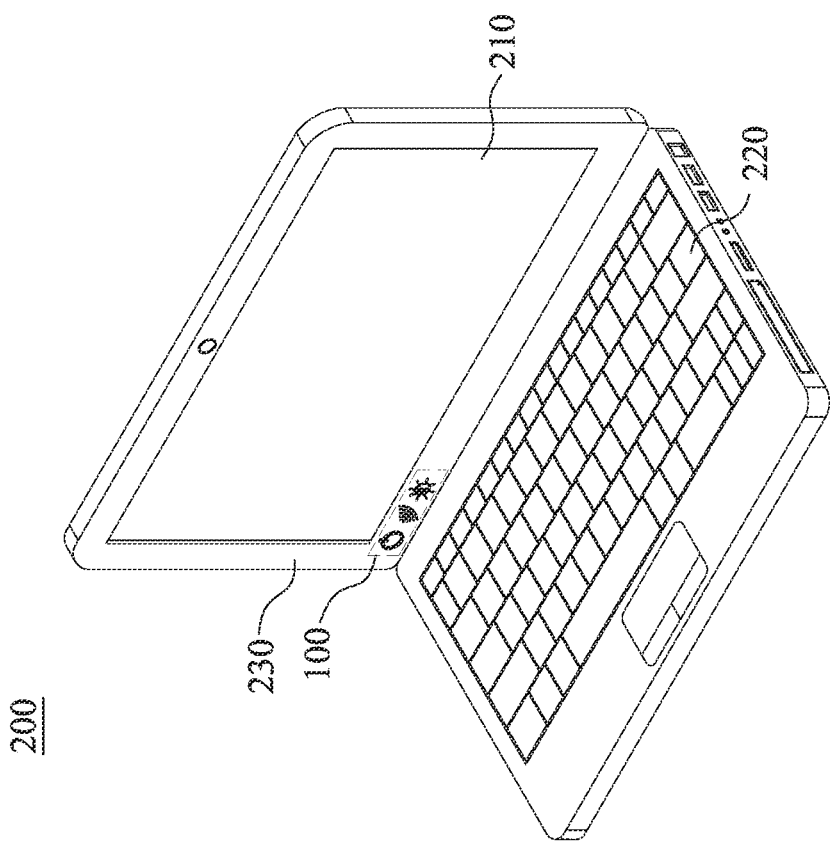
FIG. 5A and FIG. 5B are schematic oblique views of the electric device according to different embodiments of the disclosure.
Figure 5A:
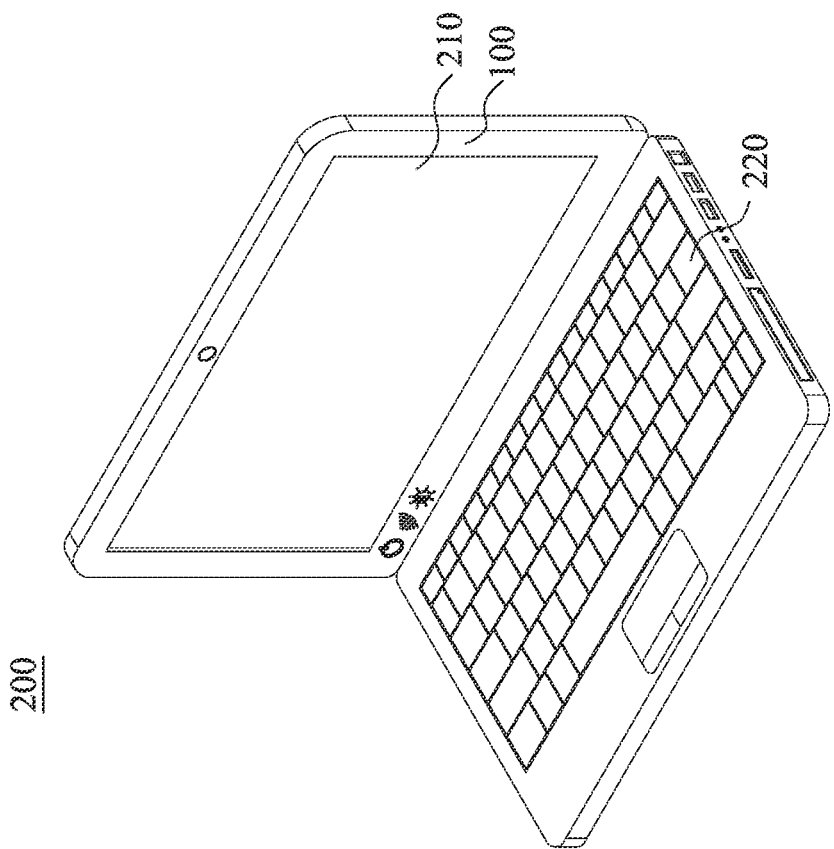
Figure 5C:
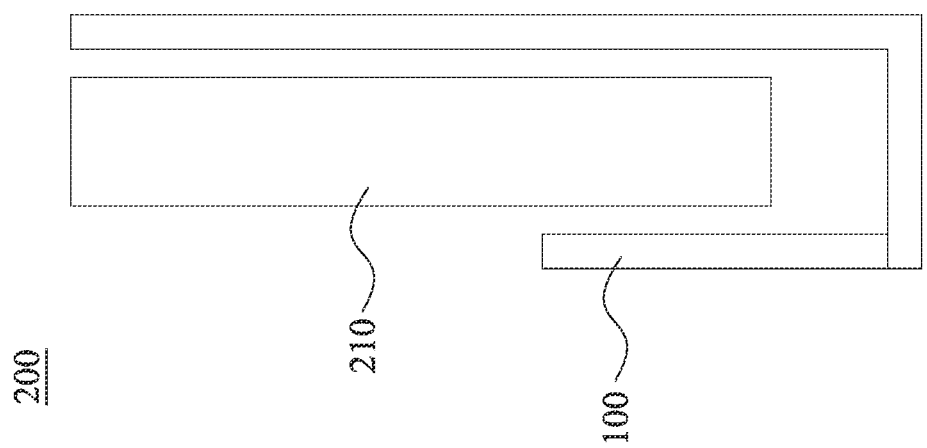
FIG. 5C is a cross-sectional view of the electronic device of FIG. 5A according to some embodiments of the disclosure.

The aforementioned touch indicating cover 100 can be utilized in various electronic devices. In the following embodiments, a notebook is taken for example, but the disclosure is not limited to. Reference is made to FIG. 5A to FIG. 5C, in which FIG. 5A and FIG. 5B are schematic oblique views of the electric device according to different embodiments of the disclosure, and FIG. 5C is a cross-sectional view of the electronic device of FIG. 5A according to some embodiments of the disclosure, in which the cross-section cuts through the touch indicating cover 100.

The electronic device 200 includes a display panel 210 and a keyboard 220. The touch indicating cover 100 can directly serve as the display frame 230 and surrounds the entire display panel 210, as shown in FIG. 5A. Alternatively, the touch indicating cover 100 can integrated with the display frame 230 and together surround the entire display panel 210, as shown in FIG. 5B.

In these embodiments, the touch indicating cover 100 can directly serve as the operation surface and the appearance surface of the electronic device 200, without adding additional cover thereon, thereby reducing the thickness of the electronic device 200. As shown in FIG. 5C, the touch indicating cover 100 itself serves as the display frame 230 or a part of the display frame 230, thus the touch indicating cover 100 partially overlaps the display panel 210 in a thickness direction of the electronic device.

Figure 6A:
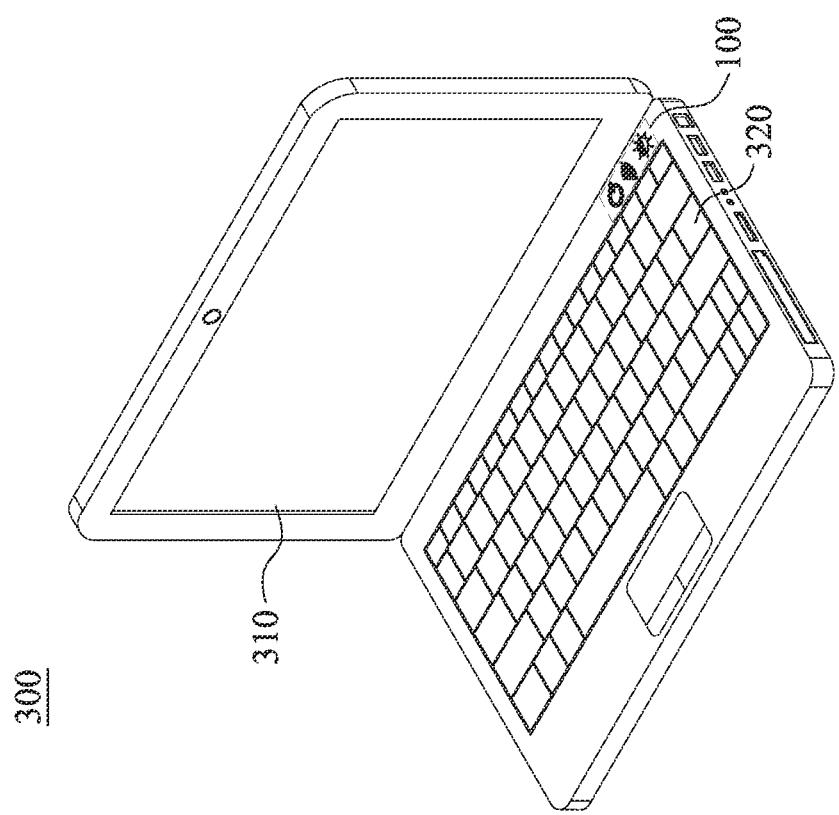
FIG. 6A is a schematic oblique view of the electric device according to some embodiments of the disclosure.

Alternatively, in some other embodiments, as shown in FIG. 6A and FIG. 6B, FIG. 6A is a schematic oblique view of the electric device according to some embodiments of the disclosure, and FIG. 6B is a cross-sectional view of the electronic device of FIG. 6A according to some embodiments of the disclosure, in which the cross-section cuts through the touch indicating cover 100. The electronic device 300 includes a display panel 310 and a keyboard 320. The touch indicating cover 100 serves as a part of the casing of the electronic device 300 and is disposed at a side of the keyboard 320. As shown in FIG. 6B, because the touch indicating cover 100 itself serves as a part of the casing of the electronic device 300, the touch indicating cover 100 partially overlaps a circuit board of the electronic device 300 in a thickness direction of the electronic device 300.

According to some embodiments of the disclosure, the touch indicating cover is formed by printing the ink and the circuit directly on the film and then directly forming the light-guide plastic piece on the film by the inject molding process, such that the light-emitting component disposed on the circuit is embedded in the light-guide plastic piece. The touch indicating cover is formed without adhesive or a film to film bonding process, thus the elements of the touch indicating cover are seamless combined. Therefore, the thickness of the electronic device using the touch indicating cover can be reduced to realize product thinning purpose.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the disclosure. In view of the foregoing, it is intended that the present invention cover modifications and variations of this invention provided they fall within the scope of the following claims and their equivalents.

What is claimed is:
1. A touch indicating cover, comprising:
a light-guide plastic piece having a first surface and a second surface opposite to each other, wherein the second surface of the light-guide plastic piece comprises a plurality of microstructures;
a printed circuit layer disposed on the first surface of the light-guide plastic piece;
an ink layer disposed on the printed circuit layer and the first surface of the light-guide plastic piece, wherein the ink layer comprises a light-emitting pattern region corresponding to the microstructures;
a passivation film disposed on the ink layer; and
a light-emitting component embedded in the first surface of the light-guide plastic piece and connected to the printed circuit layer, wherein the light-emitting component is disposed adjacent the light-emitting pattern region,
wherein the printed circuit layer comprises a touch sensing pattern surrounding the light-emitting pattern region, the light-emitting component is disposed at a side of the touch sensing pattern, and a minimum distance between the touch sensing pattern and the light-emitting component ranges from 1.5 mm to 10 mm.

2. The touch indicating cover of claim 1, wherein the printed circuit layer comprises a conductive paste or a conductive ink.

3. The touch indicating cover of claim 1, wherein the printed circuit layer comprises a touch sensing pattern, and the touch sensing pattern is a frame pattern.

4. The touch indicating cover of claim 1, wherein the printed circuit layer comprises a touch sensing pattern, and the touch sensing pattern is a hollow pattern having a plurality of lines.

5. The touch indicating cover of claim 4, wherein the touch sensing pattern is a grid pattern.

6. The touch indicating cover of claim 4, wherein the touch sensing pattern is a net pattern.

7. The touch indicating cover of claim 1, wherein the printed circuit layer comprises a touch sensing pattern, and the touch sensing pattern is a solid pattern.

8. The touch indicating cover of claim 1, wherein the printed circuit layer comprises a touch sensing pattern, and a width of the touch sensing pattern ranges from 5 mm to 25 mm.

9. An electronic device, comprising:
a display panel; and
the touch indicating cover of claim 1, wherein the touch indicating cover partially overlaps the display panel in a width direction of the electronic device, and the touch indicating cover is a frame of the electronic device.

10. An electronic device, comprising:

a circuit board; and the touch indicating cover of claim 1, wherein the touch indicating cover partially overlaps the circuit board in a width direction of the electronic device.

11. A touch indicating cover, comprising:

a light-guide plastic piece having a first surface and a second surface opposite to each other, wherein the second surface of the light-guide plastic piece comprises a plurality of microstructures;

a printed circuit layer disposed on the first surface of the light-guide plastic piece;

an ink layer disposed on the printed circuit layer and the first surface of the light-guide plastic piece, wherein the ink layer comprises a light-emitting pattern region corresponding to the microstructures;

a passivation film disposed on the ink layer; and a light-emitting component embedded in the first surface of the light-guide plastic piece and connected to the printed circuit layer, wherein the light-emitting component is disposed adjacent the light-emitting pattern region, wherein the printed circuit layer comprises a touch sensing pattern partially surrounding the light-emitting pattern region, the light-emitting component is disposed at an opening of the touch sensing pattern, and a minimum distance between the touch sensing pattern and the light-emitting component ranges from 0.5 mm to 6 mm.

12. The touch indicating cover of claim 11, wherein the printed circuit layer comprises a conductive paste or a conductive ink.

13. The touch indicating cover of claim 11, wherein the printed circuit layer comprises a touch sensing pattern, and the touch sensing pattern is a frame pattern.

14. The touch indicating cover of claim 11, wherein the printed circuit layer comprises a touch sensing pattern, and the touch sensing pattern is a hollow pattern having a plurality of lines.

15. The touch indicating cover of claim 14, wherein the touch sensing pattern is a grid pattern or a net pattern.

16. The touch indicating cover of claim 11, wherein the printed circuit layer comprises a touch sensing pattern, and the touch sensing pattern is a solid pattern.

17. The touch indicating cover of claim 11, wherein the printed circuit layer comprises a touch sensing pattern, and a width of the touch sensing pattern ranges from 5 mm to 25 mm.

18. An electronic device, comprising:

a display panel; and the touch indicating cover of claim 11, wherein the touch indicating cover partially overlaps the display panel in a width direction of the electronic device, and the touch indicating cover is a frame of the electronic device.

19. An electronic device, comprising:

a circuit board; and the touch indicating cover of claim 11, wherein the touch indicating cover partially overlaps the circuit board in a width direction of the electronic device.

* * * * *